(12) United States Patent
Kim et al.

(10) Patent No.: US 8,355,291 B2
(45) Date of Patent: Jan. 15, 2013

(54) RESISTIVE MEMORY DEVICE AND METHOD OF CONTROLLING REFRESH OPERATION OF RESISTIVE MEMORY DEVICE

(75) Inventors: Ho Jung Kim, Suwon-si (KR); Sang Beom Kang, Hwaseong-si (KR); Hong Sun Hwang, Suwon-si (KR); Chul Woo Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/231,998

(22) Filed: Sep. 14, 2011

(65) Prior Publication Data

US 2012/0063196 A1 Mar. 15, 2012

(30) Foreign Application Priority Data

Sep. 14, 2010 (KR) .................. 10-2010-0090218

(51) Int. Cl.
*G11C 7/00* (2006.01)
*G11C 7/02* (2006.01)
*G11C 11/00* (2006.01)

(52) U.S. Cl. ...... 365/222; 365/148; 365/163; 365/210.1

(58) Field of Classification Search ............... 365/222
See application file for complete search history.

(56) References Cited

U.S. PATENT DOCUMENTS

| | | | |
|---|---|---|---|
| 6,768,665 B2 * | 7/2004 | Parkinson et al. | 365/113 |
| 7,405,964 B2 | 7/2008 | Philipp et al. | |
| 7,643,373 B2 | 1/2010 | Sheu et al. | |
| 7,894,254 B2 * | 2/2011 | Lung | 365/163 |
| 2009/0190409 A1 | 7/2009 | Dittrich et al. | |

* cited by examiner

*Primary Examiner* — Son Mai
(74) *Attorney, Agent, or Firm* — Volentine & Whitt, PLLC

(57) ABSTRACT

A resistive memory device comprises a memory cell array comprising a plurality of memory units. The memory device performs a refresh read operation to check a condition of each of the memory units. Then, it determines whether to refresh each memory unit based on data read by performing the refresh read operation, and refreshes the memory unit according to a result of the determination. The refresh read operation uses a reference resistance with a smaller margin from a resistance distribution than a normal read operation.

20 Claims, 20 Drawing Sheets

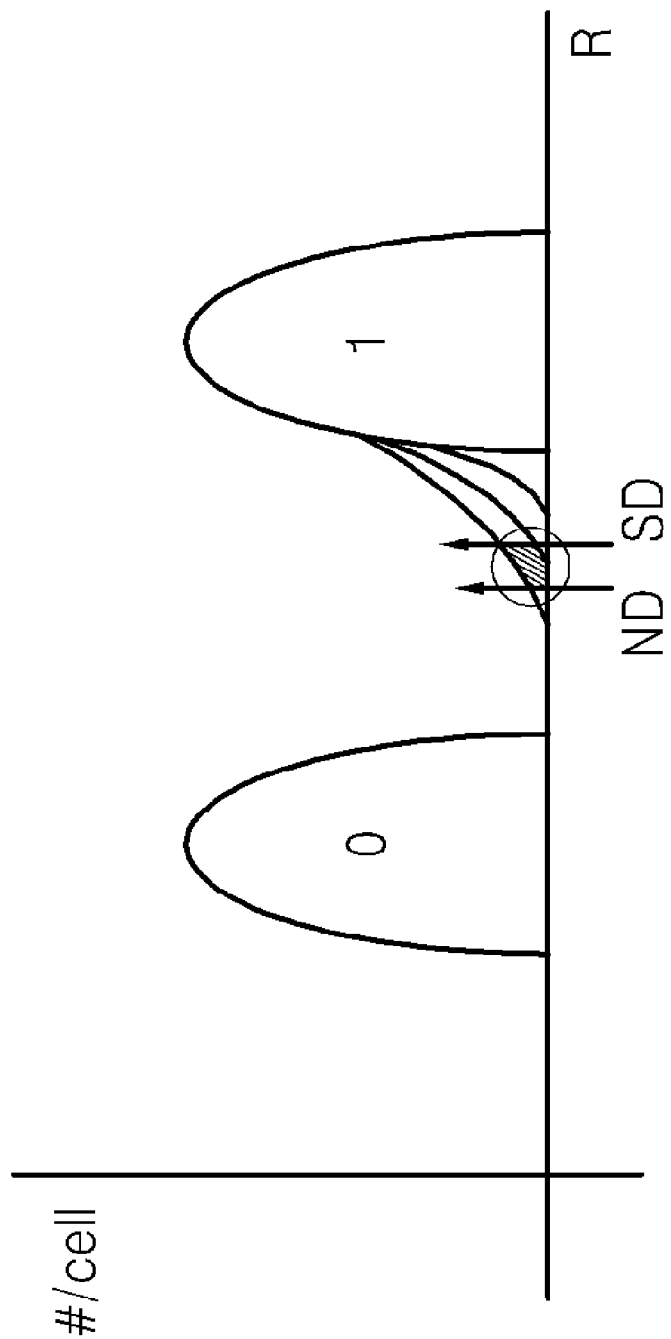

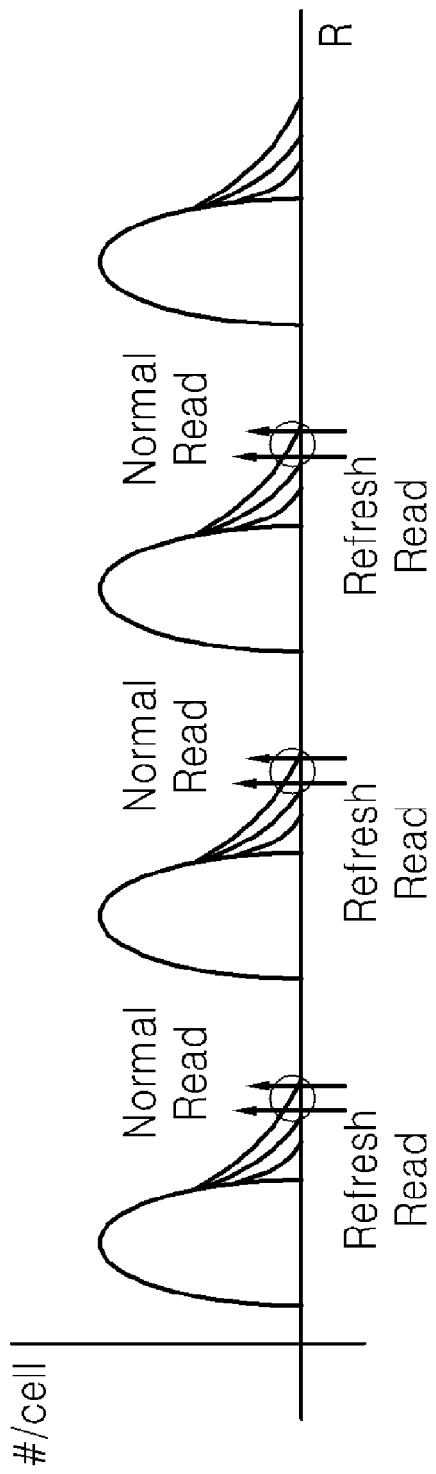

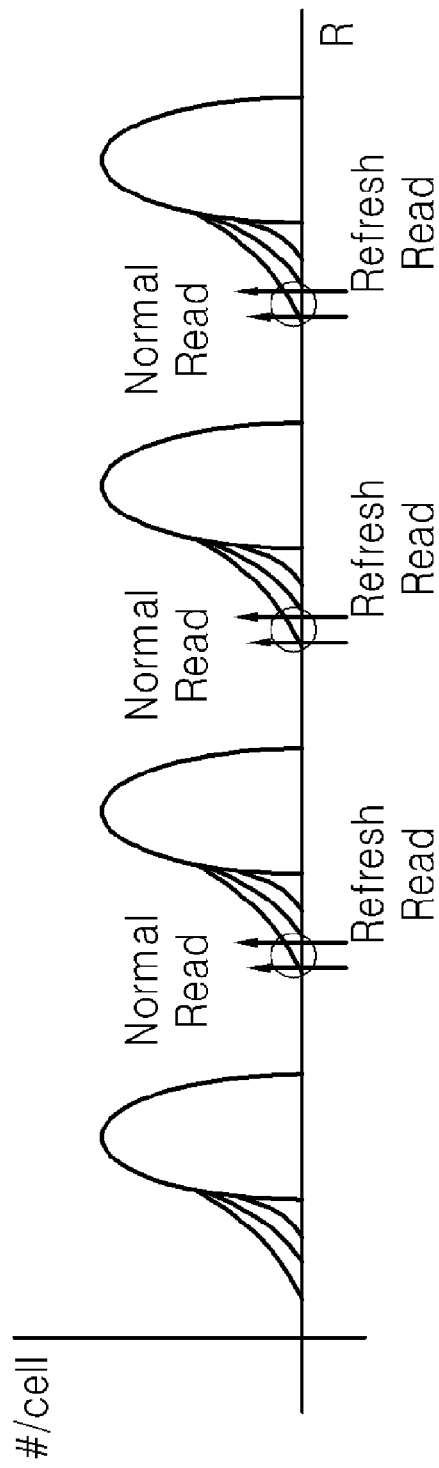

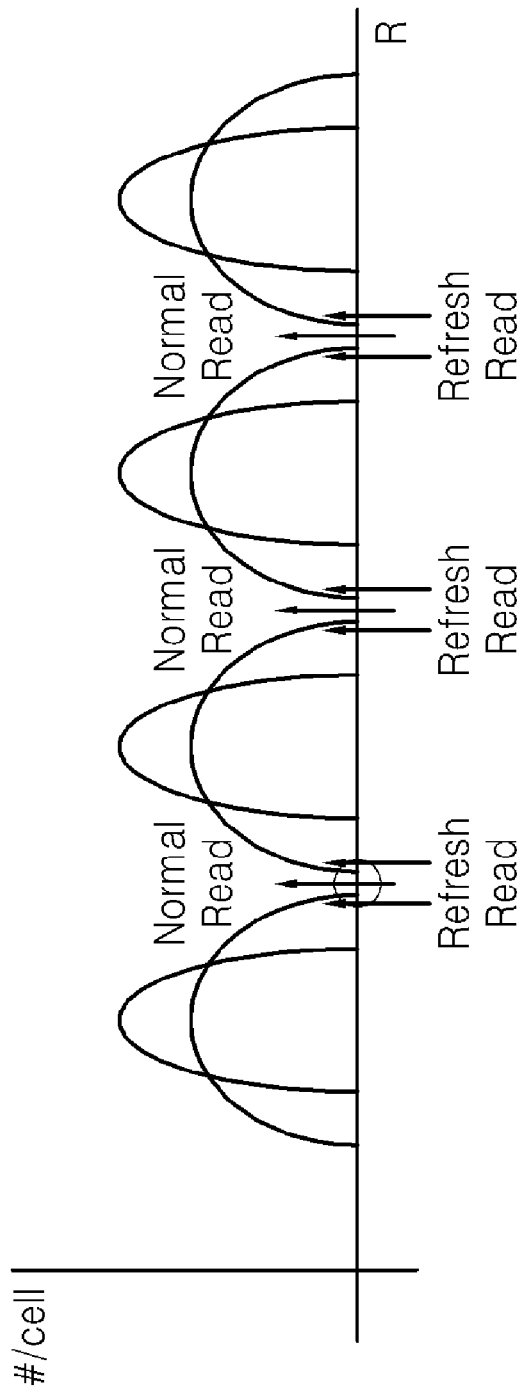

RESISTIVE MEMORY DEVICE AND METHOD OF CONTROLLING REFRESH OPERATION OF RESISTIVE MEMORY DEVICE

CROSS-REFERENCE TO RELATED APPLICATIONS

This application claims priority under 35 U.S.C. §119 to Korean Patent Application No. 10-2010-0090218 filed on Sep. 14, 2010, the disclosure of which is hereby incorporated by reference in its entirety.

BACKGROUND OF THE INVENTION

Embodiments of the inventive concept relate generally to electronic memory technologies. More particularly, embodiments of the inventive concept relate to resistive memory devices and methods of controlling refresh operations in resistive memory devices.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM), and examples of nonvolatile memory devices include flash memory, read only memory (ROM), and resistive memory.

A resistive memory comprises a material that changes resistance on the magnitude and/or direction of current or voltage applied thereto. Examples of resistive memory devices include phase-change random access memory (PRAM), which stores data using a phase-change material, resistive random access memory (RRAM), which stores data using a variable-resistance material such as complex metal oxide, and magnetic random access memory (MRAM), which stores data using a ferroelectric material.

Although resistive memory devices are capable of retaining stored data when disconnected from power, the data may nevertheless become corrupted through the passage of time, changes in the environment, or repeated reprogramming Unfortunately, this tends to decrease the reliability of the resistive memory devices.

SUMMARY OF THE INVENTION

According to one embodiment of the inventive concept, a method is provided for refreshing a resistive memory device comprising a memory cell array configured with a plurality of memory units. The method comprises performing a refresh read operation to check a condition of each of the memory units, determining whether to refresh each memory unit based on data read in the refresh read operation, and refreshing the memory unit according to a result of the determination. A reference voltage for the refresh read operation has a less margin with respect to a distribution of the data than a reference voltage for a normal read operation.

According to another embodiment of the inventive concept, a memory device comprises a resistive memory cell array comprising a plurality of memory units, a refresh controller configured to control a refresh read operation to check a condition of each of the memory units and further configured to determine whether to refresh each memory unit based on a result of the refresh read operation, and a read circuit configured to change a reference used for data reading in response to a command from the refresh controller.

According to another embodiment of the inventive concept, a memory system comprises a resistive memory device comprising a memory cell array comprising a plurality of memory cells divided into multiple memory units, a host configured to transmit a command to the resistive memory device to perform a memory access operation, a refresh controller configured to control a refresh read operation to determine a condition of a selected memory unit and further configured to determine whether to refresh the selected memory unit based on a result of the refresh read operation, and a read circuit configured to use a variable reference resistance in a read operation of the selected memory unit according to a command from the refresh controller.

These and other embodiments can maintain the reliability of stored data while reducing the amount of time required to perform refresh operations.

BRIEF DESCRIPTION OF THE DRAWINGS

The drawings illustrate selected embodiments of the inventive concept. In the drawings, like reference numbers indicate like features.

FIG. 3 is a graph showing resistance variation of a resistive memory device according to an embodiment of the inventive concept.

FIGS. 4A through 4C are graphs showing resistance variations of a resistive memory device according to various embodiments of the inventive concept.

DETAILED DESCRIPTION

Embodiments of the inventive concept are described below with reference to the accompanying drawings. These embodiments are presented as teaching examples and should not be construed to limit the scope of the inventive concept.

In the description that follows, where an element is referred to as being "connected" or "coupled" to another element, it can be directly connected or coupled to the other element or intervening elements may be present. In contrast, where an element is referred to as being "directly connected" or "directly coupled" to another element, there are no intervening elements present. As used herein, the term "and/or" includes any and all combinations of one or more of the associated listed items and may be abbreviated as "/".

Although the terms first, second, etc., may be used herein to describe various elements, these elements should not be limited by these terms. Rather, these terms are merely used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or this description, and will not be interpreted in an idealized or overly formal sense unless expressly so defined herein.

Figure 1:
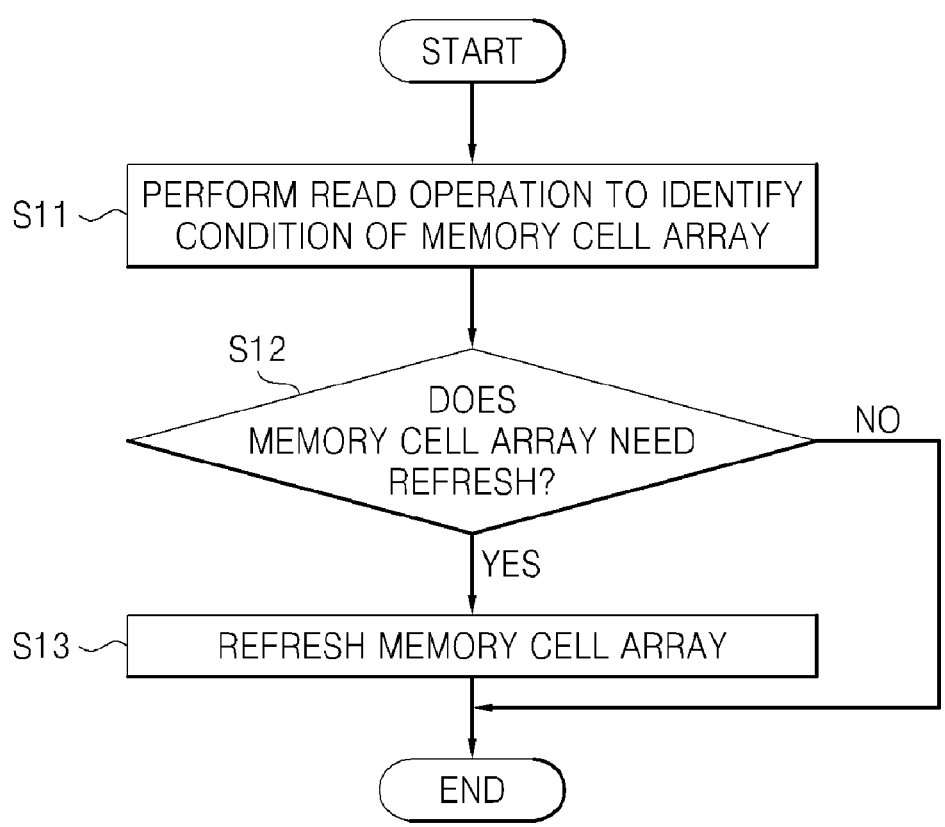
FIG. 1 is a flowchart of a method of refreshing a resistive memory device according to an embodiment of the inventive concept.

FIG. 1 is a flowchart of a method of refreshing a resistive memory device according to some embodiments of the inventive concept. In the described method, a refresh operation is performed on a resistive memory device such as a PRAM to prevent data from being corrupted or lost through the passage of time or other factors.

Referring to FIG. 1, the resistive memory device performs a read operation to detect defective bits in data or identify other conditions of a memory cell array (S11). Next, the resistive memory device determines whether the memory cell array needs a refresh operation based on a result of the read operation (S12). This determination can be performed by comparing a plurality of data values obtained using different read references or by using an error correction code (ECC). Detailed schemes for determining whether to perform a refresh operation are described in further detail with reference to other embodiments below. Where it is determined that the refresh operation is needed (S12=YES), the refresh operation is performed on only the current memory cell (S13). Otherwise (S12=NO), the method ends.

Figure 2:
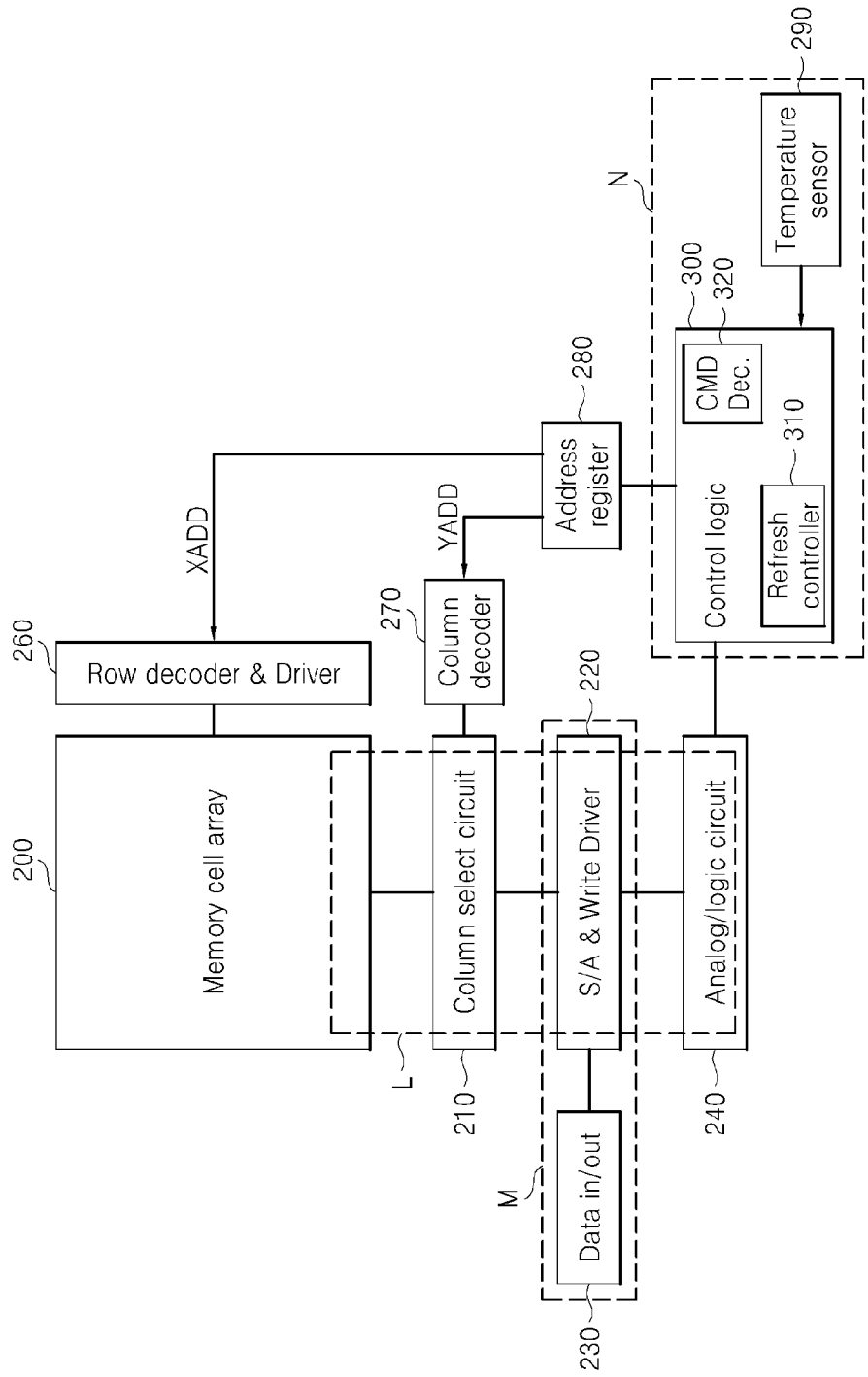
FIG. 2 is a block diagram of a memory device according to an embodiment of the inventive concept.

FIG. 2 is a block diagram of a resistive memory device according to an embodiment of the inventive concept.

Referring to FIG. 2, the resistive memory device comprises a memory cell array 200, a column select circuit 210, a read/write circuit 220, a data input/output (10) circuit 230, an analog/logic circuit 240, a row decoder and driver 260, a column decoder 270, an address register 280, a temperature sensor 290, and control logic 300.

Memory cell array 200 can be formed as a two-dimensional array or a three-dimensional array of memory cells. In a typical two-dimensional configuration, memory cell array 200 comprises a plurality of bit lines BLi ("i" is a natural number), a plurality of word lines WLj ("j" is a natural number), and a plurality of resistive memory cells. Memory cell array 200 is organized into a plurality of memory blocks each comprising a plurality of pages.

Memory cell array 200 is divided into multiple memory units that are analyzed separately to determine whether to perform a refresh operation. In other words, the resistive memory device determines whether to perform a refresh operation on each memory unit independent of the other memory units. The memory unit can be a single memory block or page or a group of a plurality of memory blocks or pages.

Row decoder and driver 260 decodes a row address output from address register 280 and selects at least one word line (or at least one row) from among word lines WLj. Column decoder 270 decodes a column address output from address register 280 and selects at least one bit line (or at least one column) among bit lines BLi.

Read/write circuit 220 writes data to a resistive memory cell or verify-reads or reads data stored in the resistive memory cell.

Control logic 300 comprises a refresh controller 310 and a command decoder 320. Refresh controller 310 comprises a counter (not shown) and controls a refresh read to be carried out in a predetermined period. The period of the refresh read is typically determined by a refresh read command received from an external source. Alternatively, the period of the refresh read can be adjusted by temperature information transmitted from a temperature sensor 290. For instance, the refresh read may be performed in a shorter period and more frequently when the memory device is at high temperature than when the memory device is at low temperature.

In response to a refresh read command from refresh controller 310, analog/logic circuit 240 sets a reference read value and transmits it to read/write circuit 220. Read/write circuit 220 then reads data from a memory unit, and refresh controller 310 determines whether to perform a refresh operation based on the data read from the memory unit. Refresh controller 310 transmits a determination result to read/write circuit 220, which determines whether a refresh operation is performed on the memory unit. The refresh operation of the memory unit is carried out by reading data from the memory unit and rewriting the data to the memory unit. An address of the memory unit to be subjected to a refresh read or a refresh operation is transmitted to column decoder 270 and row decoder and driver 260 through address register 280.

FIG. 3 is a graph showing resistance variation of a resistive memory device according to an embodiment of the inventive concept.

As illustrated in FIG. 3, a resistance memory cell stores data by changing its resistance between first and second distributions representing logic "0" data and logic "1" data, respectively. After a predetermined period of time elapses or stress is repeatedly applied to the resistance memory cell, the resistance distribution can spread out, as indicated for example by lower tails on the second distribution. This spreading is especially prominent in weak cells.

In a normal read operation of the resistance memory cell, a first reference resistance ND is used to distinguish between the first and second distributions. In a refresh read operation of the resistance memory cell, a second reference resistance SD greater than first reference resistance ND is used to determine whether the resistance memory cell programmed to the second distribution has lowered its resistance value. In the example of FIG. 3, a distance between second reference resistance SD and the lower edge of the second distribution is smaller than a distance between first reference resistance ND and the lower edge of the second distribution. Accordingly, second reference resistance SD is considered to have a smaller margin than first reference resistance ND.

Due to this smaller margin, second reference resistance SD can detect tail drift of a resistance memory cell before first reference resistance ND detects the tail drift. Consequently, second reference resistance SD increases the likelihood of detecting a resistance memory cell as defective or requiring a refresh operation. A bit that is read based on second reference resistance SD is defined as a tail bit.

FIGS. 4A through 4C are graphs showing resistance variations of a resistive memory device according to various embodiments of the inventive concept. As illustrated by these graphs, the resistance distributions of resistive memory cells can shift in a different directions under different circumstances.

Referring to FIG. 4A, where the resistance distributions have tails on the right due to elapsed time and stress, a tail bit may be detected based on a second reference resistance SD lower than a first reference resistance ND.

Referring to FIG. 4B, where the resistance distribution have tails on the left, a refresh read is performed using a second reference resistance SD higher than a first reference resistance ND.

Referring to FIG. 4C, where the resistance distributions spread in both directions, a refresh read is performed with a margin given to first reference resistance ND.

Figure 5:
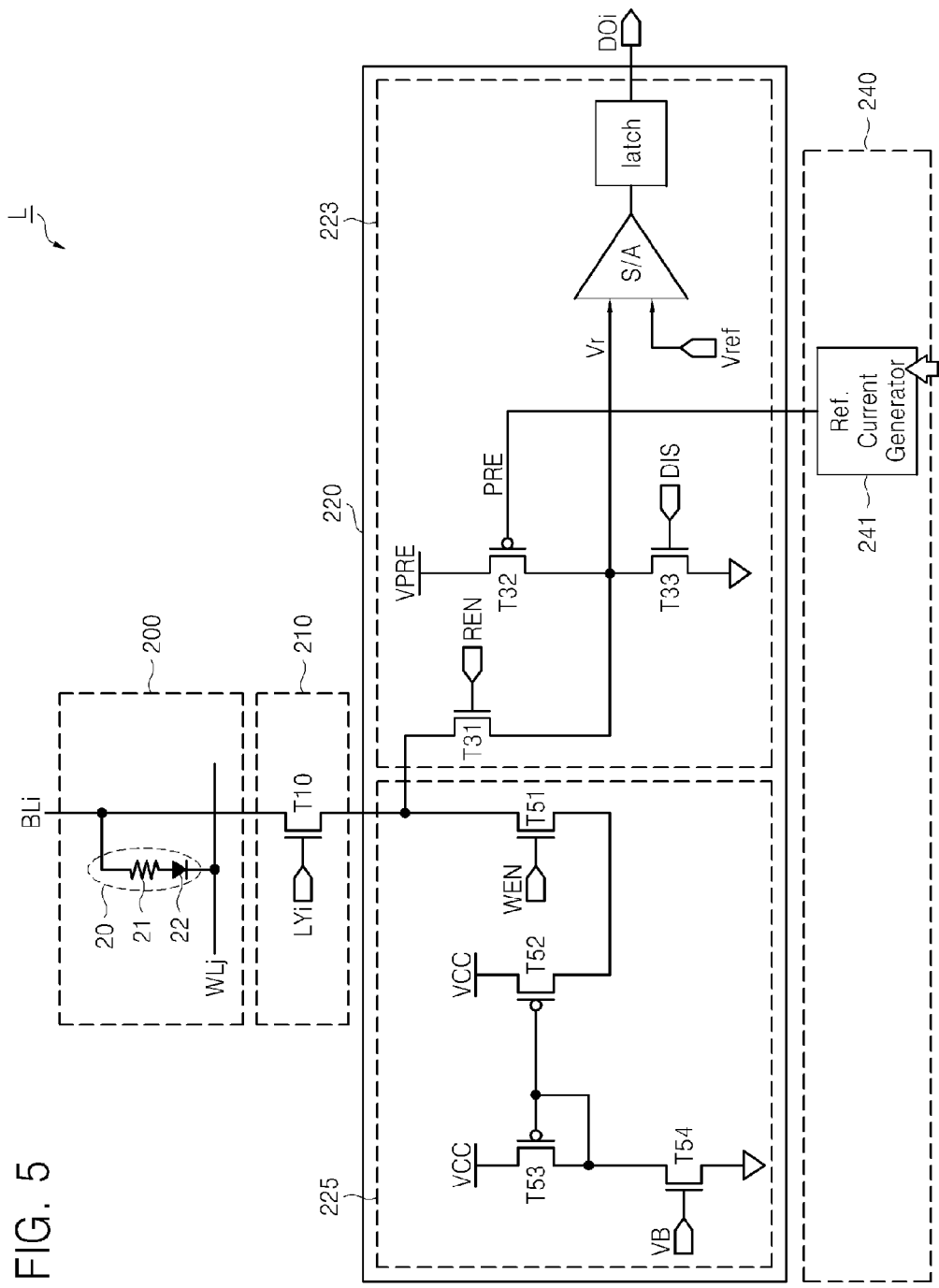
FIG. 5 is a circuit diagram of a portion L of FIG. 2 according to an embodiment of the inventive concept.

FIG. 5 is a circuit diagram of a portion L of FIG. 2 according to an embodiment of the inventive concept.

Referring to FIGS. 2 and 5, memory cell array 200 comprises a plurality of resistive memory cells 20. As an example, FIG. 5 shows a resistive memory cell 20 connected to a single word line WLj selected based on a row address XADD and a single bit line BLi selected based on a column address YADD.

Each of resistive memory cells 20 comprises a resistive memory element 21 and an access device 22 controlling a current flowing in resistive memory element 21. Resistive memory element 21 can be referred to as a memory cell or a memory material.

Each resistive memory cell 20 can be implemented by a PRAM cell or an RRAM cell. Access device 22 can be implemented as a diode type, metal-oxide semiconductor field-effect transistor (MOSFET) type, or a bipolar junction transistor (BJT) type and is also referred to as an isolation device. For convenience, access device 22 is illustrated as the diode type, but the inventive concept is not restricted to the illustrated embodiments.

Column select circuit 210 selects bit line BLi and is connected to resistive memory cell 20, column decoder 270, and read/write circuit 220.

Read/write circuit 220 comprises a write circuit 225 that writes data to resistive memory cell 20 and a read circuit 223 that reads data from resistive memory cell 20.

Write circuit 225 comprises first through fourth transistors T51, T52, T53, and T54. Where a write enable signal WEN is activated to logic "high", first transistor T51 is turned on so that write circuit 225 is electrically connected with bit line BLi. Second and third transistors T52 and T53 form a current mirror structure. A set voltage or a reset voltage is applied to resistive memory cell 20 in response to a bias voltage VB applied to a gate of fourth transistor T54. Read circuit 223 comprises first through third transistors T31, T32, and T33 and a sense amplifier S/A. Where a read enable signal REN is activated to logic high, first transistor T31 turned on so that read circuit 223 is electrically connected with bit line BLi. Where a discharge signal DIS is activated to a logic high, third transistor T33 is turned on and bit line BLi is initialized to a ground voltage.

Where a precharge signal PRE is activated to logic "low", second transistor T32 is turned on and bit line BLi is charged to a precharge voltage VPRE. Sense amplifier S/A compares a read voltage Vr with a reference voltage Vref and generates an output bit DOi indicating an on or off state of resistive memory cell 20.

Figure 6:
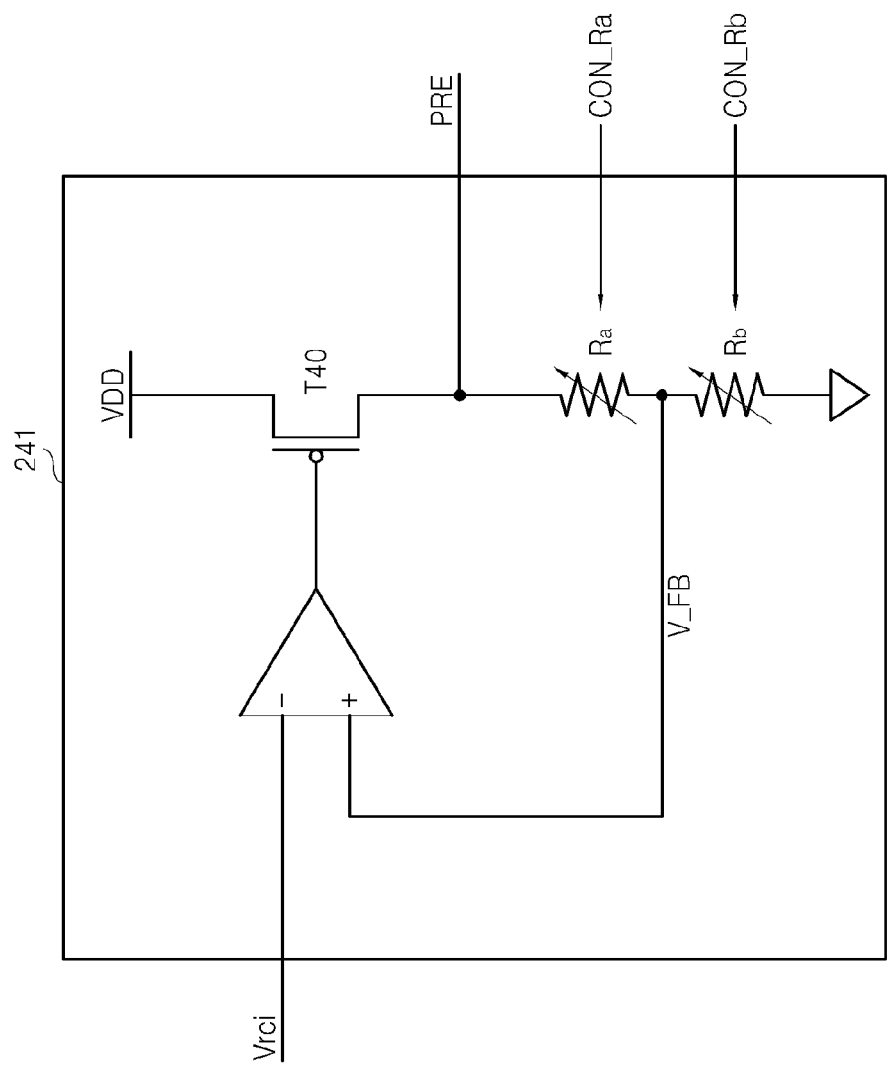
FIG. 6 is a circuit diagram of a reference current generator illustrated in FIG. 5.

FIG. 6 is a circuit diagram of a reference current generator 241 illustrated in FIG. 5. Reference current generator 241 adjusts a reference resistance for a refresh read in response to a command transmitted from refresh controller 310 to analog/logic circuit 240.

Referring to FIGS. 5 and 6, a first reference voltage Vrci is transmitted from refresh controller 310 to reference current generator 241 of analog/logic circuit 240. Reference current generator 241 compares first reference voltage Vrci with a feedback voltage V_FB and turns on or off a first transistor T40, thereby adjusting a voltage of precharge signal PRE. At this time, feedback voltage V_FB varies with a variable resistance ratio of Ra and Rb. Variable resistances Ra and Rb are adjusted by control signals CON_Ra and CON_Rb, respectively, received from refresh controller 310. Consequently, where a variable resistance ratio of Ra and Rb is adjusted, feedback voltage V_FB is changed, and therefore, the voltage of precharge signal PRE is adjusted. As a result, the reference resistance for the refresh read is adjusted.

Figure 7A:
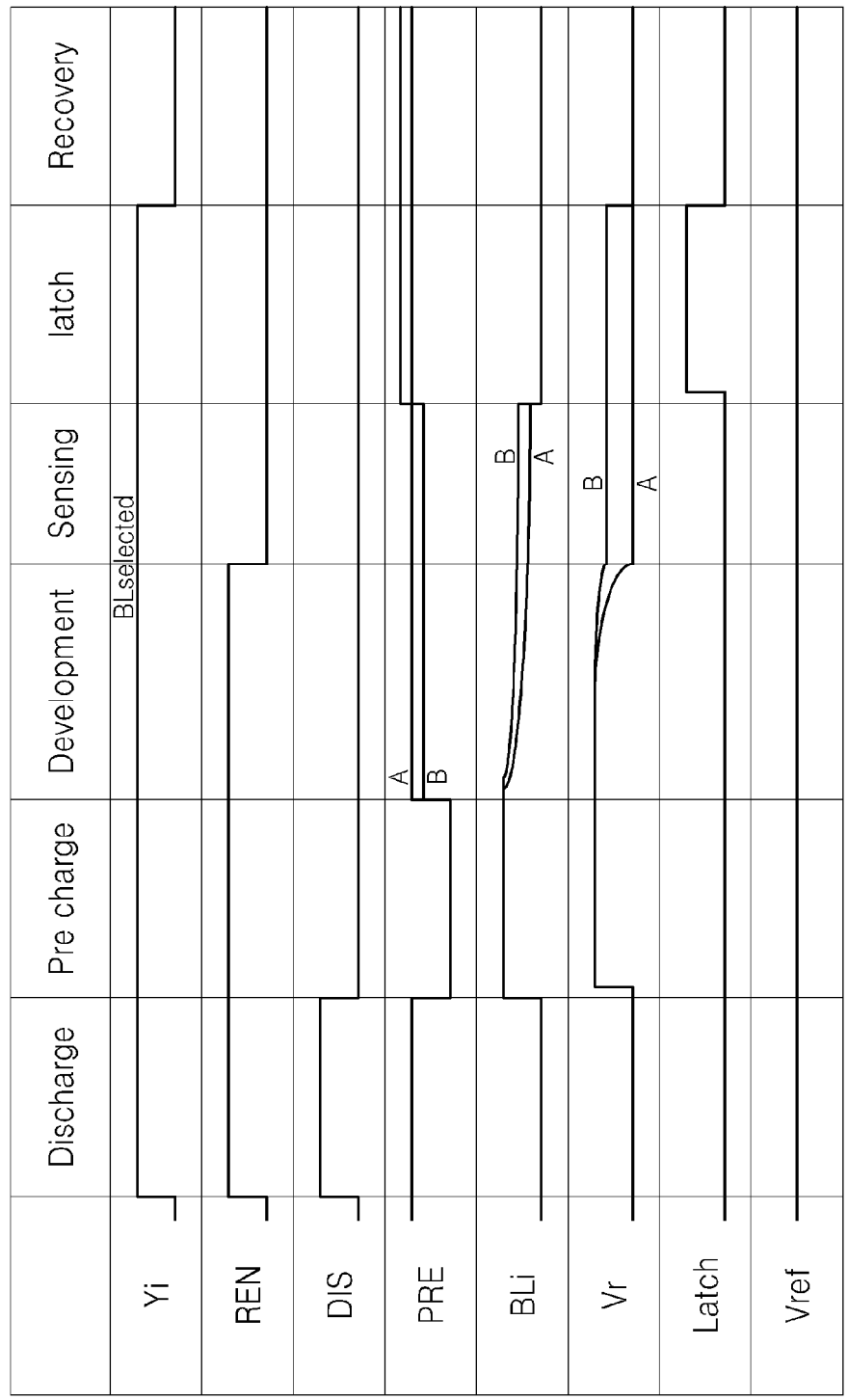
FIGS. 7A and 7B are timing charts of a read circuit illustrated in FIG. 5.
Figure 7B:
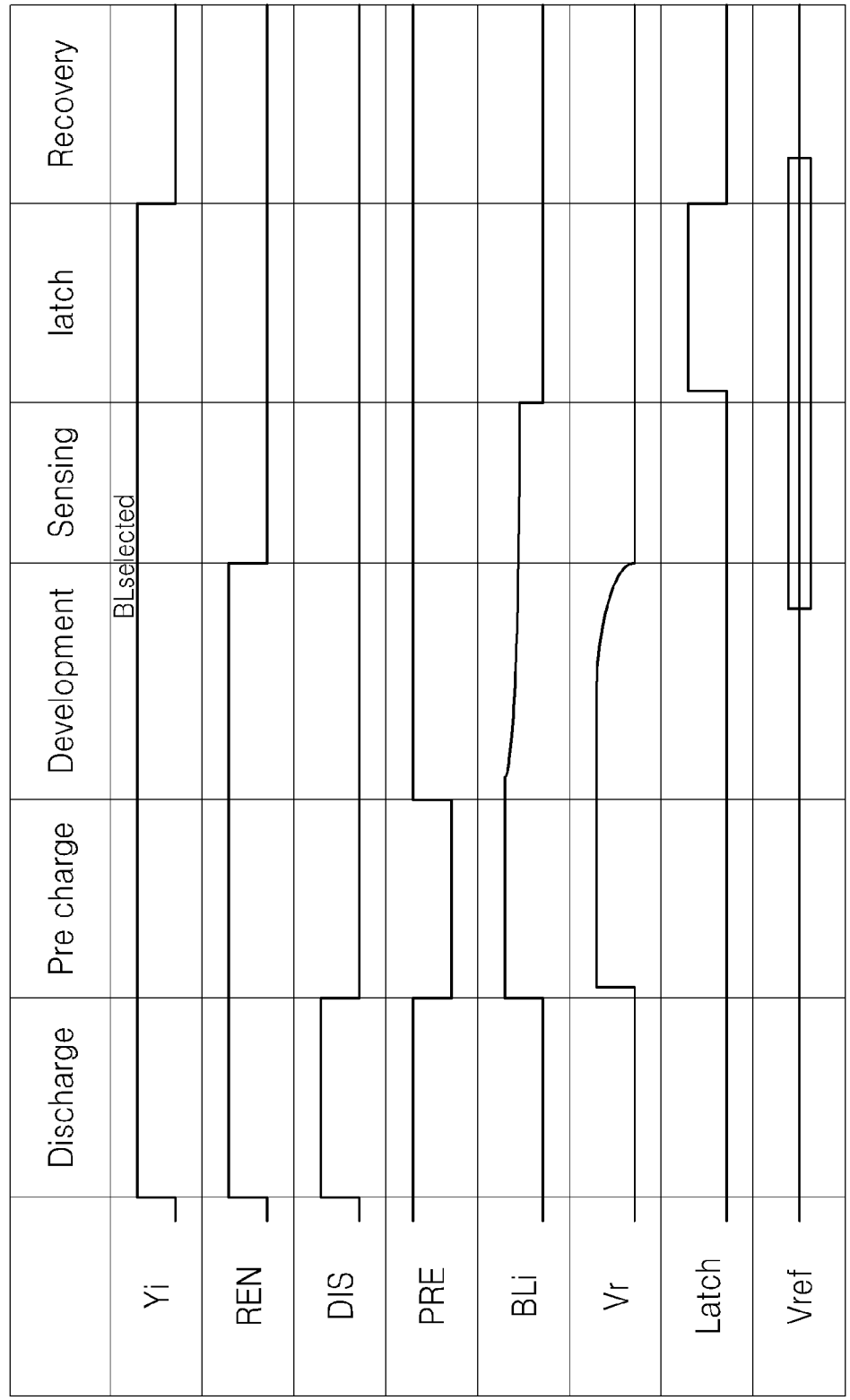

FIGS. 7A and 7B are timing charts of read circuit 223 illustrated in FIG. 5. More specifically, FIG. 7A is a timing chart of the operation of read circuit 223 when a reference resistance level is adjusted using precharge signal PRE, and FIG. 7B is a timing chart of the operation of read circuit 223 when a reference resistance level is adjusted using a reference voltage Vref.

Referring to FIGS. 5 and 7A, where a select signal Yi is activated to a logic high and read enable signal REN is activated to logic high, read circuit 223 is electrically connected with resistive memory cell 20.

Where discharge signal DIS is activated to logic high in a discharge period, third transistor T33 of read circuit 223 is turned on and bit line BLi is initialized to the ground voltage. Where precharge signal PRE is activated to logic low in a precharge period, second transistor T32 is turned on and bit line BLi is charged to precharge voltage VPRE. Precharge signal PRE can be adjusted to a level A or B by reference current generator 241. As the level of precharge signal PRE increases, a reference resistance for reading data decreases. For instance, because first reference resistance ND for a normal read is lower than second reference resistance SD for a refresh read in FIG. 3, the level A of precharge signal PRE used to read first reference resistance ND is controlled to be higher than level B of precharge signal PRE used to read second reference resistance SD. However, the inventive concept is not restricted to this example. Because the cell resistance variation may change as illustrated in FIGS. 4A through 4C, precharge signal PRE can be adjusted according to first reference resistance ND and second reference resistance SD.

Where precharge signal PRE is deactivated to a logic high in a development period, precharge voltage VPRE is interrupted and a voltage of bit line BLi electrically connected with grounded word line WLj through resistive memory cell 20 drops. At this time, a voltage of a bit line connected to a memory cell in a high-resistance off-state gradually drops while a voltage of a bit line connected to a memory cell in a low-resistance on-state relatively rapidly drops. In addition, because the small amount of current is transmitted to a bit line when precharge signal PRE is at high level A, a voltage of the bit line connected to a memory cell relatively drops rapidly. Where precharge signal PRE is at low level B, the voltage of the bit line connected to the memory cell gradually drops. In a sensing period, read enable signal REN is deactivated to logic low and bit line BLi is electrically disconnected from read circuit 223. At this point, a voltage at a first terminal of sense amplifier S/A is read voltage Vr. A set verify voltage or a reset verify voltage is applied as reference voltage Vref to a second terminal of sense amplifier S/A according to a set-write operation or a reset-write operation. Sense amplifier S/A compares read voltage Vr with reference voltage Vref and reads data from resistive memory cell 20. Data output from sense amplifier S/A is stored in a latch.

The timing chart illustrated in FIG. 7B is similar to that illustrated in FIG. 7A. However, while a reference resistance for a refresh read and a reference resistance for a normal read are controlled by adjusting precharge signal PRE in the embodiment illustrated in FIG. 7A, they are controlled based on a plurality of different levels of reference voltage Vref input to the second terminal of sense amplifier S/A in the embodiment illustrated in FIG. 7B.

Figure 8:
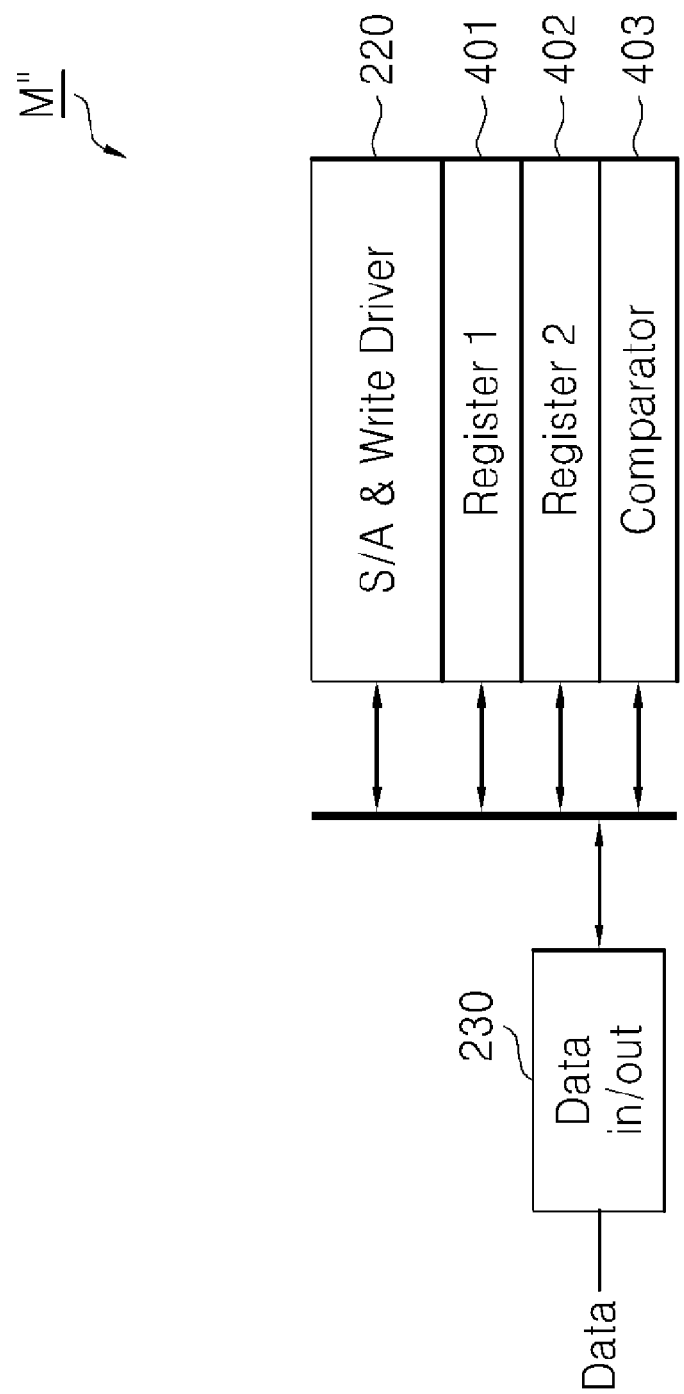
FIG. 8 is a block diagram of a portion M of FIG. 2 according to an embodiment of the inventive concept.

FIG. 8 is a block diagram of a portion M of FIG. 2. In FIG. 8, portion M has been modified to include additional features not shown in FIG. 2. Accordingly, it has been relabeled M".

Referring to FIG. 8, read/write circuit 220 is modified to further comprise registers 401 and 402 and a register comparator 403. Registers 401 and 402 store data read in a normal read or a refresh read operation, and they may flexibly be used as a cache and a write buffer. Data stored in registers 401 and 402 is transmitted to external destination through data input/output circuit 230. Register comparator 403 compares data that has been read and outputs a comparison result so that refresh controller 310 can determine whether to perform a refresh operation.

Figure 9:
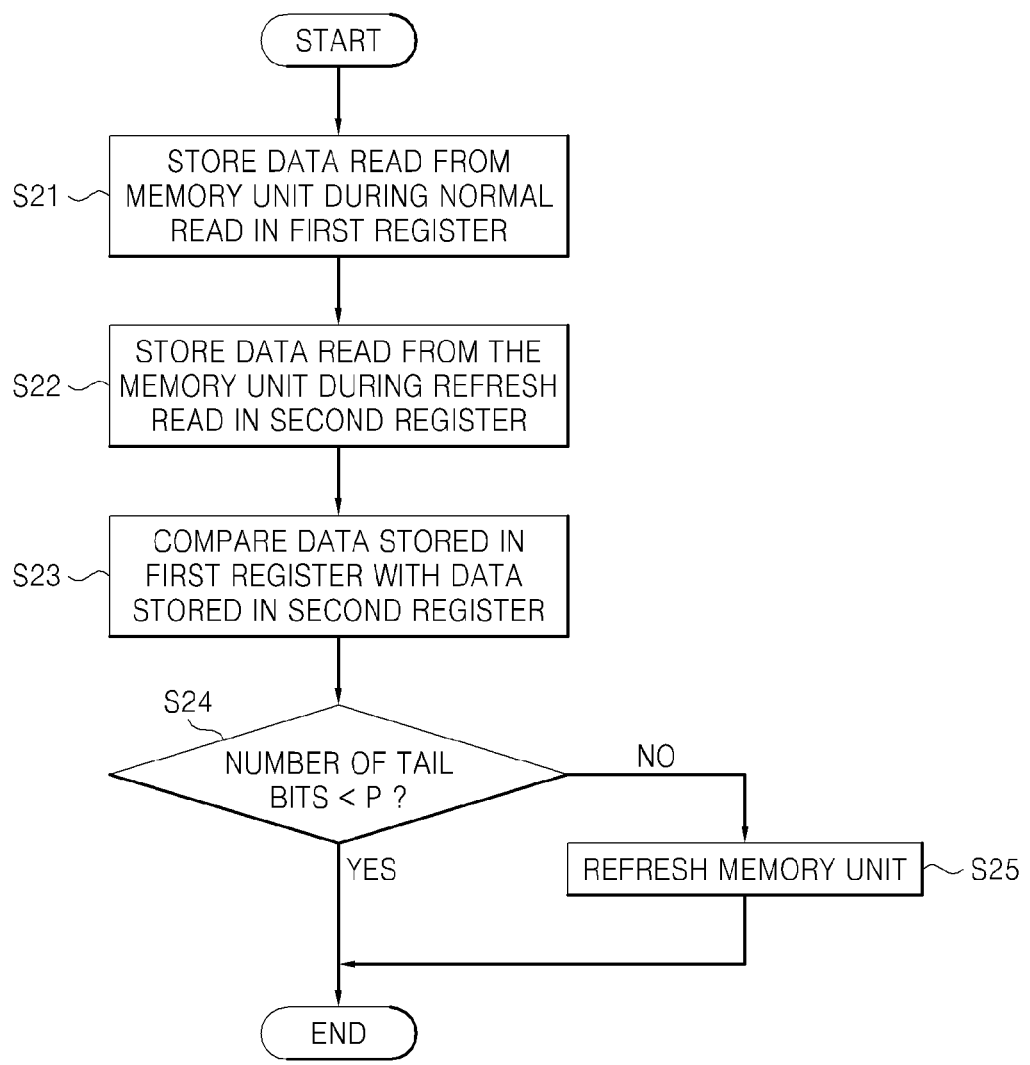
FIG. 9 is a flowchart of a method of refreshing a resistive memory device according to an embodiment of the inventive concept.

FIG. 9 is a flowchart of a method of determining whether data is defective using a plurality of registers according to an embodiment of the inventive concept. For explanation purposes, it will be assumed that the method is performed in a resistive memory device incorporating the structure illustrated in FIG. 8.

Referring to FIGS. 8 and 9, where a normal read is performed using first reference resistance ND in response to a command from a host, data read from a memory unit is stored in at least one register (e.g., first register 401) among the plurality of registers adjacent to a memory cell array (S21). In addition, where the memory device is turned on or off or in an idle mode or in each predetermined period set in the resistive memory device, data read from the memory unit during a refresh read using second reference resistance SD is stored in second register 402 (S22). Register comparator 403 compares the data stored in first register 401 with the data stored in second register 402 to determine whether the data in first register 401 is the same as the data in second register 402 (S23).

Where a bit in the data stored in first register 401 is different from a corresponding bit in the data stored in second register 402, the bit in the data is referred to as a tail bit. A refresh operation is performed on the memory unit (S25) only where the number of tail bits is at least a threshold value P (S24=NO). For instance, where the data stored in first register 401, i.e., the data read using the normal read is "0000111100001111" and the data stored in second register 402, i.e., the data read using the refresh read is "0000111100000000", the number of tail bits is 4. If threshold value P is 3, the number of tail bits is greater than threshold value P. Accordingly, the memory unit is refreshed. On the other hand, where the number of defective bits or tail bits is less than threshold value P (S24=YES), the method ends without performing the refresh operation.

The memory unit may flexibly be a page, a block, or a group of pages or blocks and threshold value P may be changed depending on the size of the memory unit. For instance, where the memory unit is a single page, the memory unit may be refreshed if the number of tail bits is at least 4.

Figure 10:
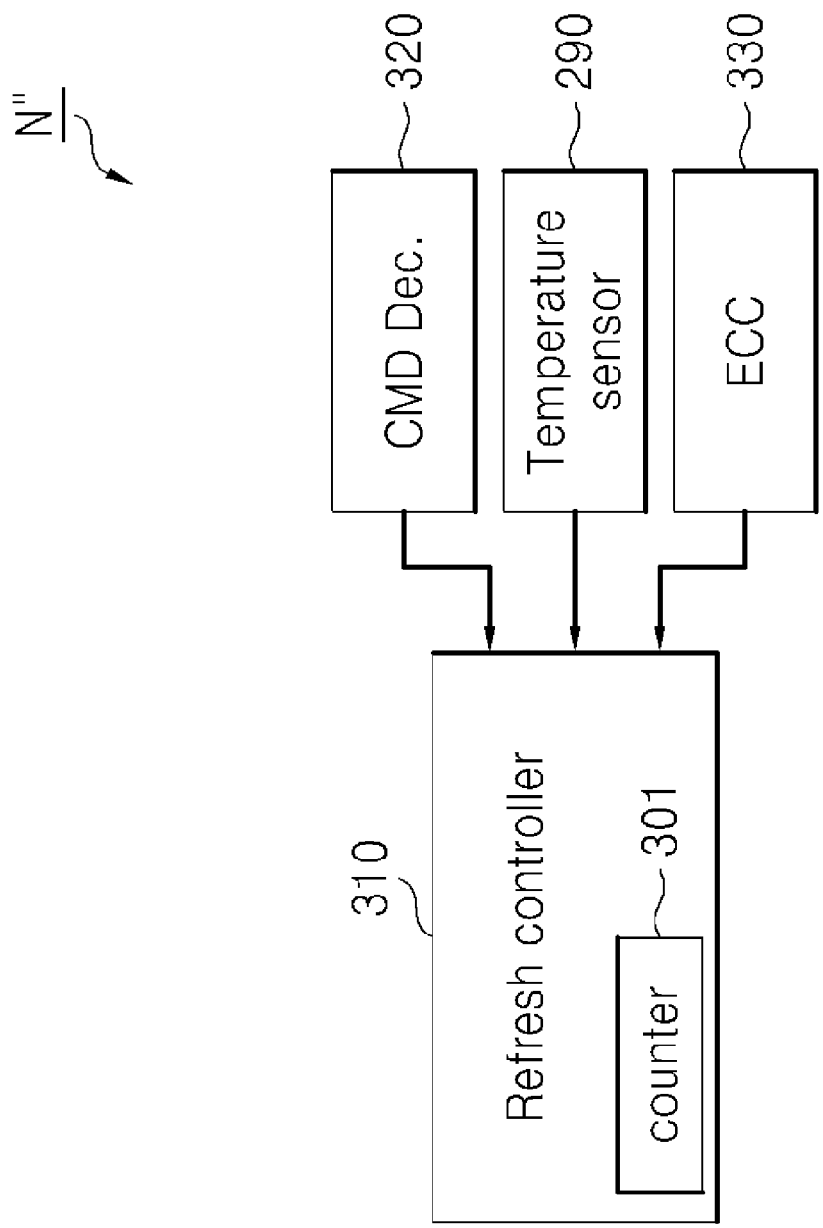
FIG. 10 is a block diagram of a portion N of FIG. 2 according to an embodiment of the inventive concept.

FIG. 10 is a block diagram of a portion N illustrated in FIG. 2. In FIG. 10, portion N has been modified to include additional features not shown in FIG. 2. Accordingly, it has been relabeled N".

Referring to FIG. 10, refresh controller 310 comprises a counter 301. Refresh controller 310 periodically performs a refresh read operation. The period of the refresh read operation is set by an external command and also adjusted by temperature sensor 290. A refresh operation may be performed in response to an external command instructing a refresh read operation or a refresh operation. In addition, defectiveness of data may be checked using an ECC engine 330. Information regarding the defectiveness can then be used in the determination of whether to perform a refresh read operation.

A memory device incorporating ECC engine 330 comprises memory cell array 200 divided into a data area storing normal data and an ECC area storing ECC codes. ECC engine 330 generates an ECC code corresponding to data when the data is written, reads the ECC code from the ECC area when the data is read, and performs an ECC operation to detect an error.

Figure 11:
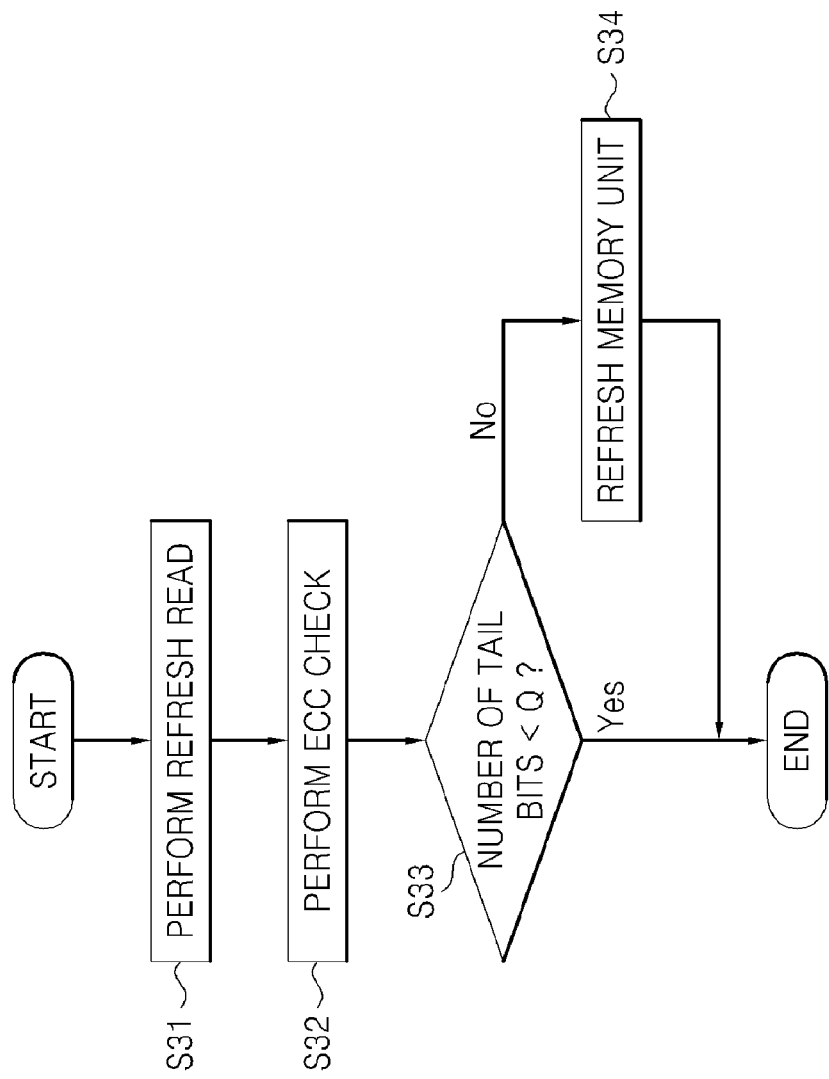
FIGS. 11 and 12 are flowcharts of a method of refreshing a resistive memory device according to embodiments of the inventive concept.
Figure 12:
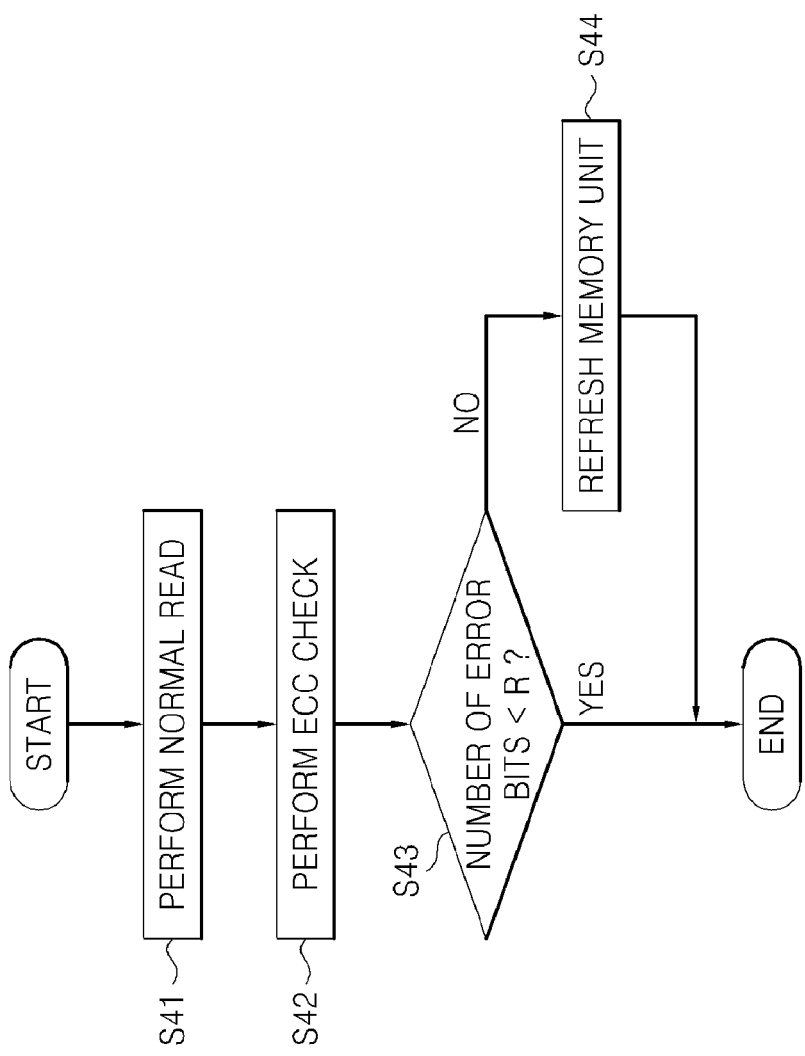

FIGS. 11 and 12 are flowcharts of methods of refreshing a resistive memory device according to embodiments of the inventive concept. In these embodiments, a decision of whether to perform a refresh operation is made using an ECC check rather than a plurality of registers.

Referring to FIG. 11, a refresh read is performed (S31). This operation can be performed upon turning the memory device on or off, when the memory device is in an idle mode, or at a predetermined periodic interval. An ECC check is performed on data read from a memory unit in the refresh read to determine whether the data is defective (S32). At this time, a reference resistance for the refresh read has less margin from the distribution of the data to be read than a reference resistance for a normal read. In this case, a tail bit that is not a defective bit but is a bit having a high probability of error may be detected. Where the number of tail bits is at least a predetermined value Q (S33=No), the memory unit is refreshed (S34)(where Q is a natural number).

The memory unit may flexibly be a page, a block, or a bank and predetermined value Q may be changed depending on the size of the memory unit. For instance, where the memory unit is a page, the capacity of the memory unit may be 2 to 16 Kbytes. Where an ECC covering a 4-bit error is used for the memory unit, predetermined value Q will be appropriately 2 or 4. In this case, where at least two or four tail bits are detected in the memory unit, the memory unit is refreshed. Where a 6-bit ECC is used, predetermined value Q will be appropriately 3 or 6.

Referring to FIG. 12, the memory device performs a normal read on a memory unit in response to a command from a host (S41). Next, it is determined whether data read from the memory unit in the normal read is defective (S42). This determination is made by using an ECC check. Where the number of error bits is at least a predetermined value R (where R is a natural number) (S43=NO), the memory unit is refreshed (S44).

The memory unit may flexibly be a page, a block, or a bank, and predetermined value R may be changed depending on the size of the memory unit. For instance, where the memory unit is a page, the capacity of the memory unit may be 2 to 16 Kbytes. Where an ECC covering a 4-bit error is used for the memory unit, predetermined value R will appropriately be 1 or 2. In this case, where at least one or two error bits are detected in the memory unit, the memory unit is refreshed. Where a 6-bit ECC is used, predetermined value R will appropriately be 2 or 3.

R denotes the number of error bits only while Q denotes the number also including tail bits which are likely to be error bits. Accordingly, Q is generally greater than R.

Figure 13:
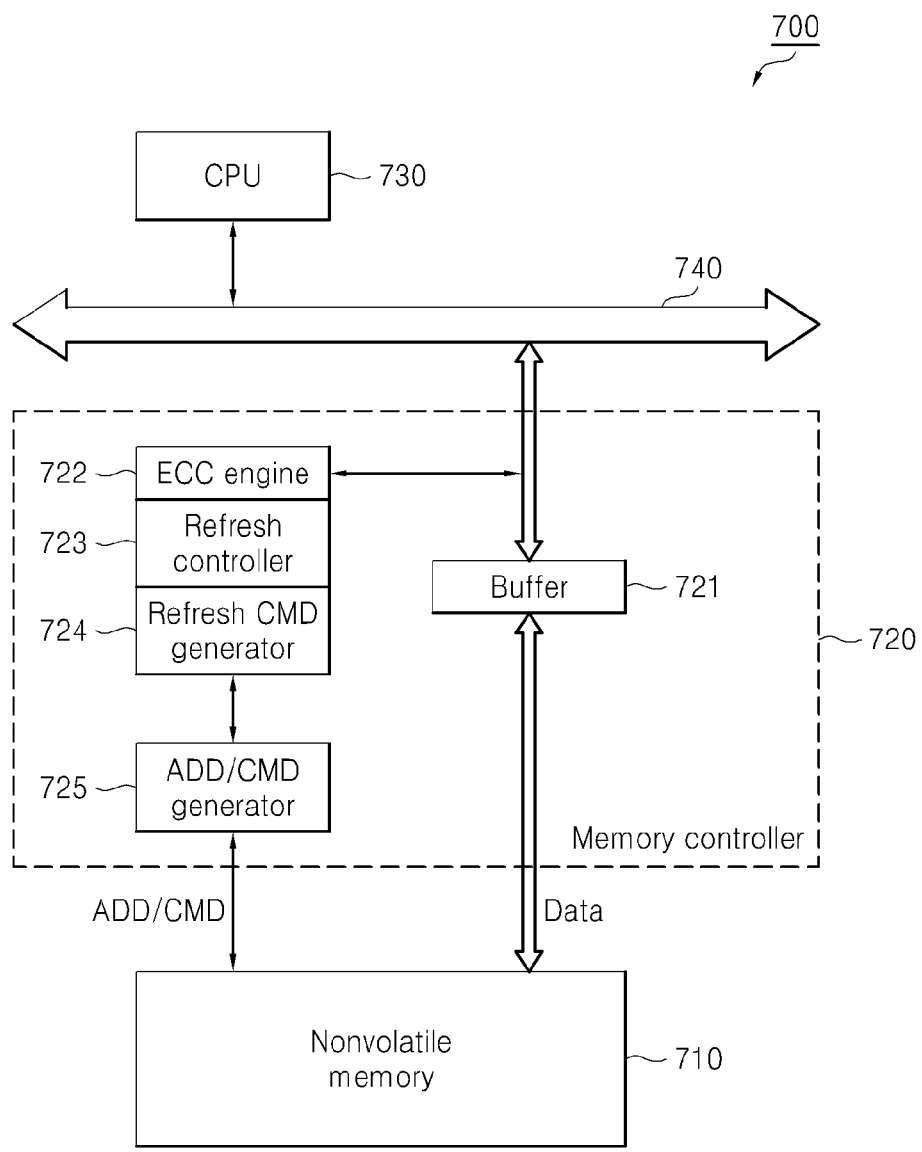
FIG. 13 is a block diagram of a computer system according to an embodiment of the inventive concept.

FIG. 13 is a block diagram of a computer system 700 according to an embodiment of the inventive concept. Computer system 700 can be applied to a personal digital assistant (PDA), a portable computer, a web tablet, a wireless phone, a mobile phone, a digital music player, or any other device that can transmit and/or receive information in a wireless environment.

Referring to FIG. 13, computer system 700 comprises a central processing unit (CPU) 730, a memory controller 720, and a resistive memory device 710. CPU 730 and memory controller 720 communicate with each other via a bus 740.

Memory controller 720 comprises a buffer 721 storing data transmitted between CPU 730 and resistive memory device 710, an ECC engine 722, and a refresh controller 723. Defects in data are checked using ECC engine 722. Where it is found that resistive memory device 710 has the at least predetermined number of defective bits, refresh controller 723 refreshes resistive memory device 710. A refresh command generator 724 and an address/command generator 725 in memory controller 720 transmit an address ADD and a command CMD to resistive memory device 710.

Figure 14:
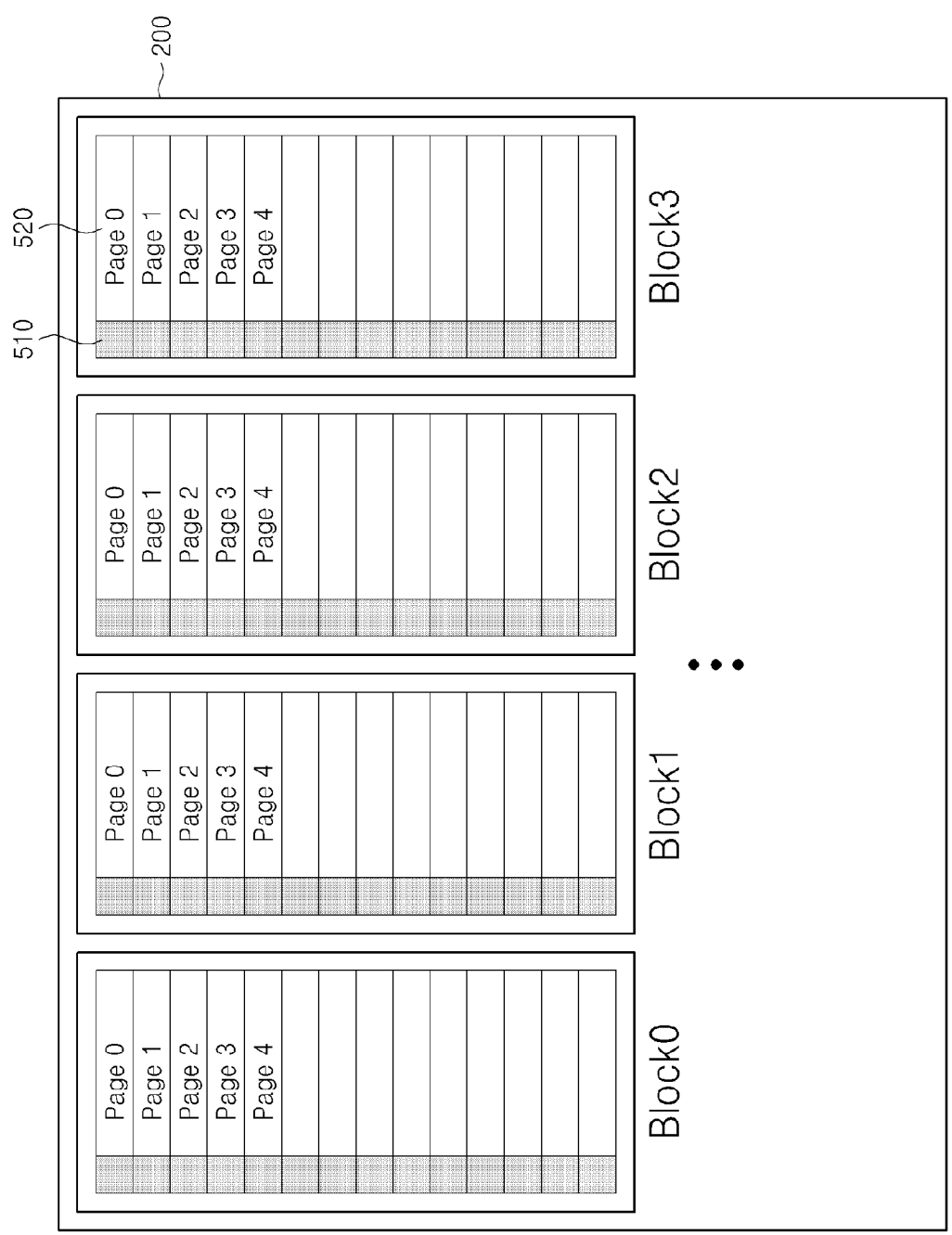
FIG. 14 is a block diagram of a memory cell array according to an embodiment of the inventive concept.

FIG. 14 shows an example of memory cell array 200 illustrated in FIG. 2. In this example, memory cell array 200 comprises a plurality of memory blocks. Each of the memory blocks comprises a plurality of memory pages. In addition, memory cell array 200 comprises a memory unit which may be the subject of a refresh operation. The memory unit may be a single memory block or page or a group of a plurality of memory blocks or pages.

The memory unit is divided into a normal cell 520 storing data and a dummy cell 510 used to check data reliability. The number of dummy cells 510 in the memory unit varies with the size of the memory unit.

Figure 15:
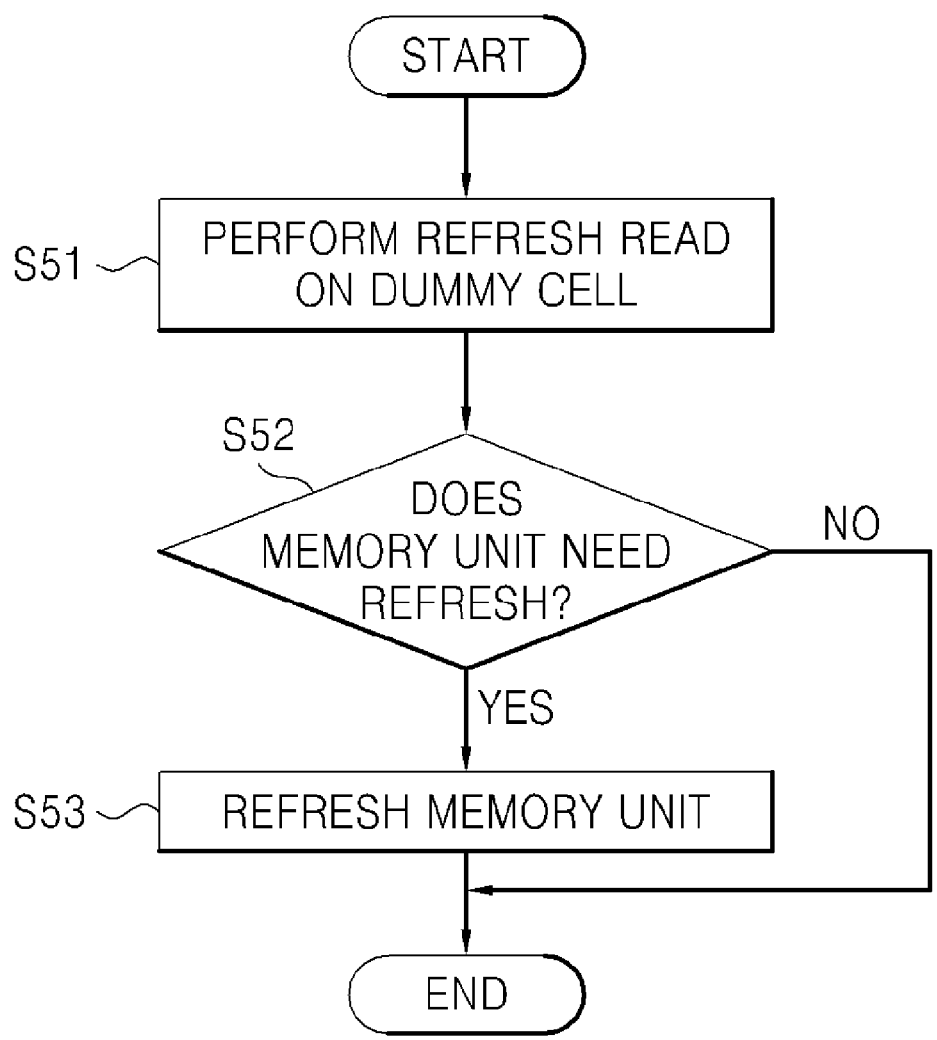
FIG. 15 is a flowchart of a method of refreshing a memory device including a dummy cell according to an embodiment of the inventive concept.

FIG. 15 is a flowchart of a method of refreshing a resistive memory device comprising memory cell array 200 of FIG. 14.

Referring to FIGS. 14 and 15, apart from input/output of data, data in a predetermined pattern is written to dummy cell 510 and then a refresh read is periodically performed on the dummy cell (S51). Next, it is determined whether a memory unit needs to be refreshed (S52). For instance, where a defect is detected in dummy cell 510 as a result of an ECC check or comparing data stored in a plurality of registers, it may be determined that the memory unit needs to be refreshed. Where the memory unit needs to be refreshed (S52=YES), normal cell 520 and dummy cell 510 in the memory unit are refreshed (S53). Otherwise (S52=NO), the method ends without refreshing the memory unit.

Figure 16:
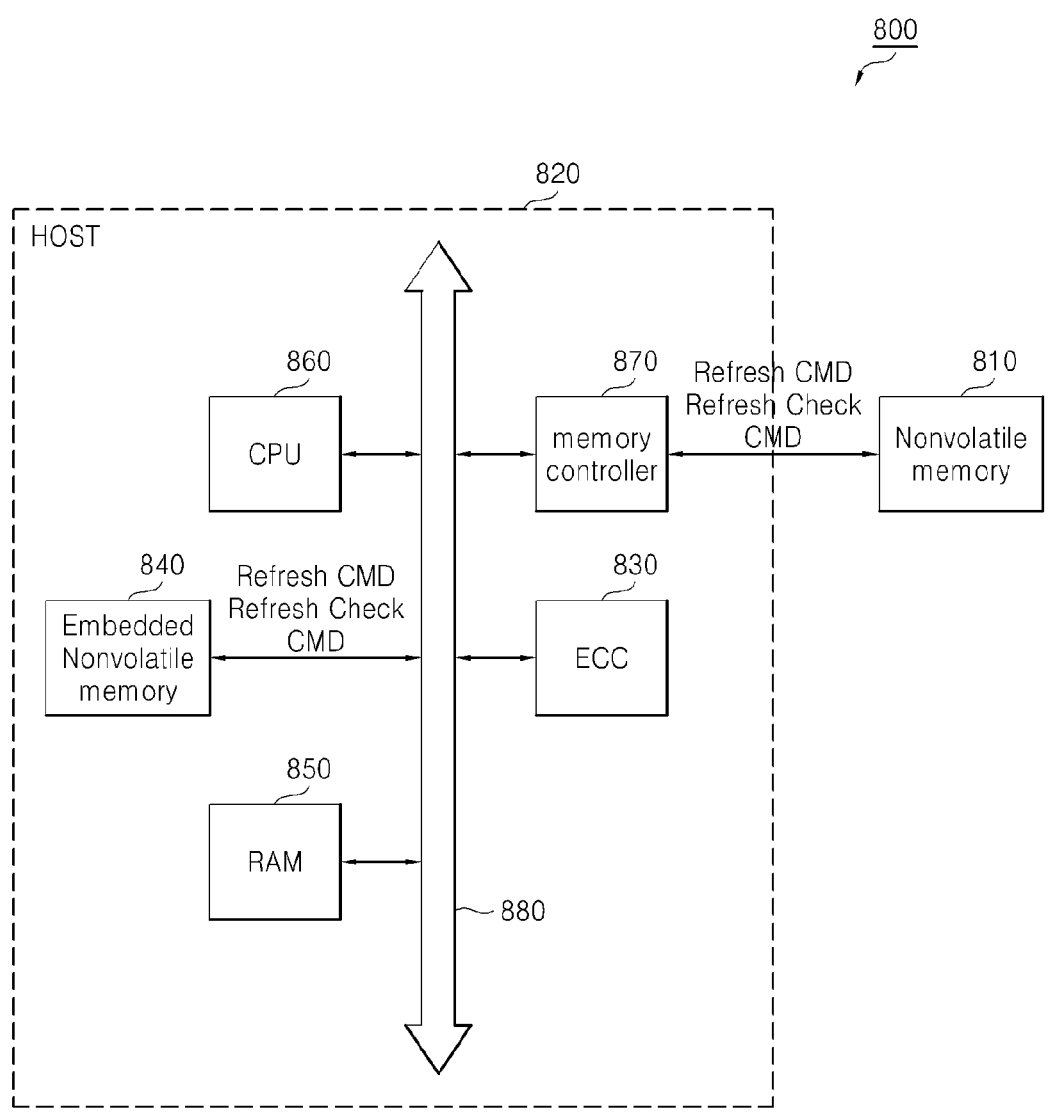
FIG. 16 is a block diagram of an information processing system according to an embodiment of the inventive concept.

FIG. 16 is a block diagram of an information processing system 800 incorporating a resistive memory device 810 according to an embodiment of the inventive concept. Information processing system 800 can be, for example, a mobile computing system or desktop computer.

Referring to FIG. 16, information processing system 800 comprises resistive memory device 810 and a host 820. Host 820 comprises a memory controller 870, a CPU 860, an ECC block 830, an embedded non-volatile memory 840, and a random access memory (RAM) 850, which are electrically connected to one another via a system bus 880. Resistive memory device 810 stores data processed by CPU 860 or data input from an external source.

To read data from resistive memory device 810, CPU 860 transmits a data input/output command or a refresh read command to resistive memory device 810. At this time, ECC block 830 in host 820 detects a defect in the data. Data defect information about defects detected by ECC block 830 is transmitted to CPU 860 via system bus 880.

CPU 860 determines whether to perform a refresh operation based on the data defect information. Where resistive memory device 810 has at least predetermined number of defective bits, CPU 860 transmits a refresh command to resistive memory device 810.

Although not shown, information processing system 800 can further comprise an application chipset, a camera image processor, and an input/output device.

Figure 17:
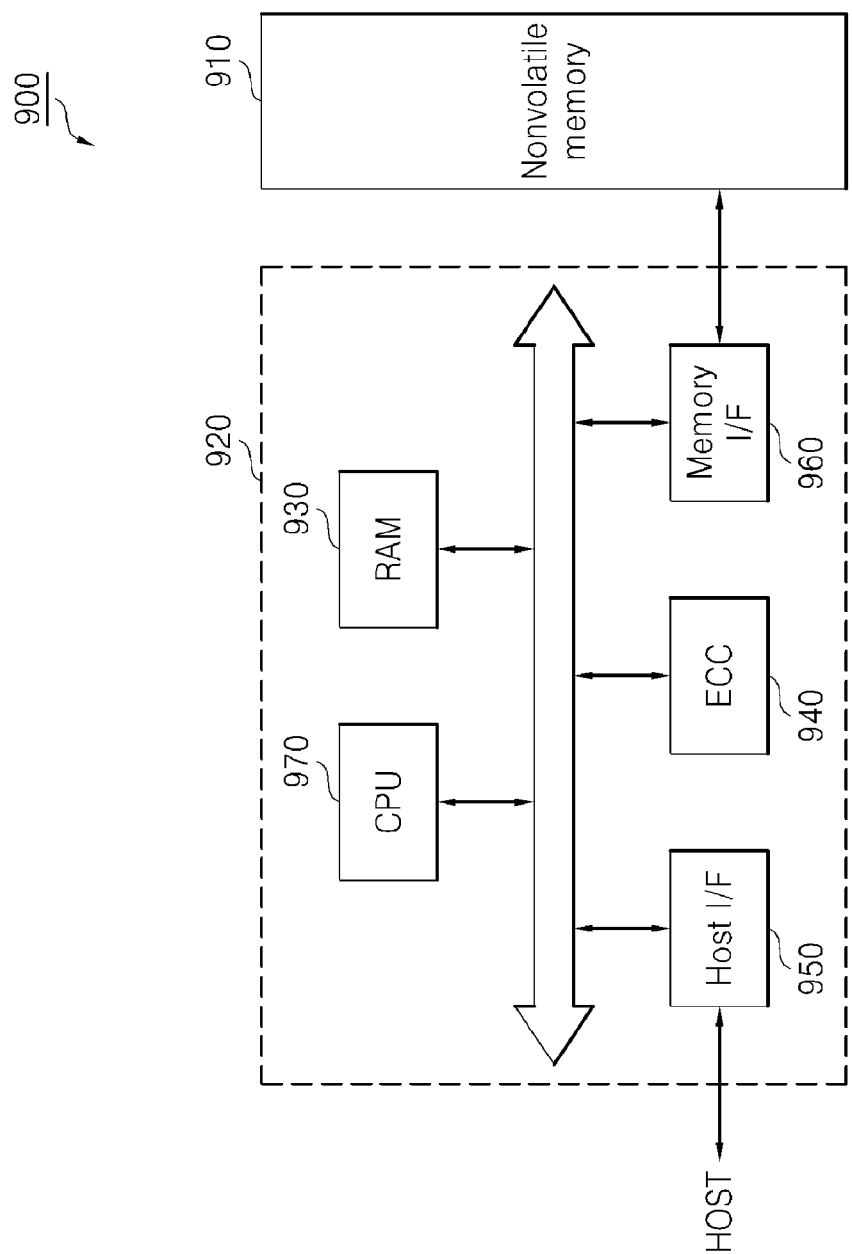
FIG. 17 is a block diagram of a memory system according to an embodiment of the inventive concept.

FIG. 17 is a block diagram of a memory system 900 according to an embodiment of the inventive concept. Memory system 900 comprises a host, a memory controller 920 that controls overall data exchange between the host and a resistive memory device 910 and the memory device 910.

A RAM 930 is used as a working memory of a CPU 970. A host interface 950 implements a data exchange protocol of the host connected to memory system 900. An ECC block 940 detects and corrects a defect in data read from resistive memory device 910. Where the number of defective bits detected in the data from resistive memory device 910 is at least a predetermined value, resistive memory device 910 is refreshed. A memory interface 960 interfaces with resistive memory device 910. CPU 970 also controls memory controller 920 for data exchange. Although not shown, memory system 900 may also comprise a read-only memory (ROM) storing code data for interface with the host.

Embodiments of the inventive concept can take various forms, such as hardware, software, or combination of hardware and software. The inventive concept can also be embodied as computer-readable codes on a computer-readable medium. The computer-readable recording medium is any data storage device that can store data as a program which can be thereafter read by a computer system. Examples of computer-readable recording media include read-only memory, random-access memory, CD-ROMs, magnetic tapes, floppy disks, and optical data storage devices. The computer-readable recording medium can also be distributed over network coupled computer systems so that the computer-readable code is stored and executed in a distributed fashion. Also, functional programs, codes, and code segments to accomplish embodiments of the inventive concept can be created by programmers skilled in the art.

As indicated by the foregoing, according to some embodiments of the inventive concept, a refresh operation can be performed on a resistive memory device according to various criteria in a periodic or aperiodic fashion. This can improve the reliability of the resistive memory device while reducing a number of unnecessary operations.

While the inventive concept has been particularly shown and described with reference to certain embodiments, it will be understood by those of ordinary skill in the art that various changes in forms and details may be made therein without departing from the scope of the inventive concept as defined by the following claims.

What is claimed is:

1. A method of refreshing a resistive memory device comprising a memory cell array configured with a plurality of memory units, the method comprising:
performing a refresh read operation to check a condition of each of the memory units;
determining whether to refresh each memory unit based on data read in the refresh read operation; and
refreshing the memory unit according to a result of the determination,
wherein a reference voltage for the refresh read operation has a less margin with respect to a distribution of the data than a reference voltage for a normal read operation.

2. The method of claim 1, wherein the memory cell array comprises a plurality of memory blocks, each of the memory blocks comprises a plurality of memory pages, and the memory unit is defined by at least one memory block or at least one memory page.

3. The method of claim 1, wherein the refresh read operation is performed upon turning on or off a memory system including the resistive memory device, during an idle mode of the resistive memory device, in response to a command received by the resistive memory device, or at a predetermined periodic interval.

4. The method of claim 3, wherein the refresh read is performed more frequently where the resistive memory device is at higher temperature than when the resistive memory device is at lower temperature.

5. The method of claim 1, wherein the resistive memory device comprises a plurality of memory cell arrays stacked in three dimensions.

6. The method of claim 1, wherein the reference voltage for the refresh read operation and the reference voltage for the normal read operation are resistance values and a reference resistance for the refresh read operation varies with a shape of a resistance distribution of memory cells or a condition of the memory cells.

7. The method of claim 1, wherein the resistive memory device uses a first reference resistance for reading data in response to a normal read command received from an external source and uses a second reference resistance for determining whether to perform a refresh operation in response to a refresh read command received from a refresh controller, and the first reference resistance is different from the second reference resistance.

8. The method of claim 1, wherein performing the refresh read operation and determining whether to refresh each memory unit comprises:
storing first data read in response to a normal read command from an external source in a first register;
storing second data read in response to a refresh read command from a refresh controller in a second register;
comparing the first data stored in the first register with the second data stored in the second register and detecting a tail bit at which the first and second data are different from each other; and
determining that a memory unit having at least a predetermined number of tail bits needs a refresh operation.

9. The method of claim 8, wherein each of the memory units comprises a normal cell used to store data and a dummy cell used to check the condition of each memory unit,
wherein performing the refresh read operation and determining whether to refresh the memory unit is performed only on the dummy cell, and the memory unit comprising the dummy cell is refreshed when it is determined that the refresh operation is needed.

10. The method of claim 1, wherein performing the refresh read operation and determining whether to refresh the memory unit comprises:
reading data in response to a refresh read command from a refresh controller;
performing an error correction code (ECC) check with respect to the data; and
determining that a refresh operation is needed where the number of defective bits detected in the ECC check is at least a predetermined value.

11. The method of claim 10, wherein each of the memory units comprises a normal cell used to store data and a dummy cell used to check the condition of each memory unit,
wherein performing the refresh read operation and determining whether to refresh the memory unit is performed only on the dummy cell, and
wherein the memory unit comprising the dummy cell is refreshed when it is determined that the refresh operation is needed.

12. The method of claim 10, wherein the predetermined value is less than the number of bits that can be corrected by the ECC.

13. The method of claim 10, wherein the resistive memory device is a phase change random access memory (PRAM).

14. A memory device, comprising:
a resistive memory cell array comprising a plurality of memory units;
a refresh controller configured to control a refresh read operation to check a condition of each of the memory units and further configured to determine whether to refresh each memory unit based on a result of the refresh read operation; and
a read circuit configured to change a reference used for data reading in response to a command from the refresh controller.

15. The memory device of claim 14, wherein the reference is a reference resistance, the memory cell array comprises a plurality of memory blocks, each of the memory blocks comprises a plurality of memory pages, and the memory unit is defined by at least one memory block or at least one memory page.

16. The memory device of claim 14, wherein the refresh read operation is performed upon turning on or off of a memory system comprising the resistive memory device, during an idle mode of the memory device, in response to a command received by the memory device, or in a predetermined periodic interval.

17. The memory device of claim 14, further comprising an error correction code (ECC) circuit configured to correct errors in stored data, wherein the refresh controller initiates the refresh read operation on one of the memory units upon determining that it includes a number of errors greater than a number of errors that can be corrected by the ECC circuit.

18. A memory system, comprising:
a resistive memory device comprising a memory cell array comprising a plurality of memory cells divided into multiple memory units;
a host configured to transmit a command to the resistive memory device to perform a memory access operation;
a refresh controller configured to control a refresh read operation to determine a condition of a selected memory unit and further configured to determine whether to refresh the selected memory unit based on a result of the refresh read operation; and a read circuit configured to use a variable reference resistance in a read operation of the selected memory unit according to a command from the refresh controller.

19. The memory system of claim 18, wherein the refresh read operation is performed upon turning on or off of the memory system, during an idle mode of the resistive memory device, in response to a command received by the memory device, or in a predetermined periodic interval.

20. The memory system of claim 18, wherein the condition of the selected memory unit is a number of errors in data stored within the selected memory unit.

* * * * *